United States Patent
Kim et al.

(10) Patent No.: US 7,499,353 B2
(45) Date of Patent: Mar. 3, 2009

(54) INTEGRATED CIRCUIT CHIP HAVING NON-VOLATILE ON-CHIP MEMORIES FOR PROVIDING PROGRAMMABLE FUNCTIONS AND FEATURES

(75) Inventors: Neil Y. Kim, Laguna Niguel, CA (US); Pieter Vorenkamp, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/878,612

(22) Filed: Jul. 25, 2007

(65) Prior Publication Data
US 2008/0037351 A1    Feb. 14, 2008

Related U.S. Application Data

(63) Continuation of application No. 11/034,101, filed on Jan. 13, 2005, now Pat. No. 7,263,027.

(60) Provisional application No. 60/618,258, filed on Oct. 14, 2004.

(51) Int. Cl.
*G11C 7/00* (2006.01)

(52) U.S. Cl. .................. 365/200; 365/230.03; 365/96; 365/225.7

(58) Field of Classification Search .............. 365/200, 365/230.03, 96, 210, 225.7
See application file for complete search history.

(56) References Cited

U.S. PATENT DOCUMENTS

| 5,966,339 | A | 10/1999 | Hsu et al. | |
|---|---|---|---|---|
| 6,184,720 | B1 | 2/2001 | Kim et al. | |
| 6,668,302 | B1 | 12/2003 | Fox | |
| 6,693,481 | B1 | 2/2004 | Zheng | |
| 6,694,492 | B1 | 2/2004 | Shakkarwar | |
| 6,697,284 | B2 * | 2/2004 | Marotta | 365/189.03 |
| 6,751,121 | B2 * | 6/2004 | Marotta | 365/185.09 |
| 6,856,531 | B2 | 2/2005 | Turner et al. | |
| 7,046,569 | B2 | 5/2006 | Ito et al. | |
| 7,263,027 | B2 | 8/2007 | Kim et al. | |
| 2001/0039601 | A1 * | 11/2001 | Leung et al. | 711/101 |
| 2003/0123314 | A1 | 7/2003 | Buer et al. | |
| 2003/0126513 | A1 | 7/2003 | Wuidart | |

OTHER PUBLICATIONS

European Search Report issued in EP Appl. No. 05021147.3 on Mar. 10, 2006, (3 pages).

* cited by examiner

*Primary Examiner*—Son Dinh
(74) *Attorney, Agent, or Firm*—Sterne, Kessler, Goldstein & Fox, PLLC.

(57) ABSTRACT

An integrated circuit chip having programmable functions and features in which one-time programmable (OTP) memories are used to implement a non-volatile memory function, and a method for providing the same. The OTP memories may be based on poly-fuses as well as gate-oxide fuses. Because OTP memories are small, less die area is utilized as compared to metal fuses. Additionally, because OTP memories can be implemented as part of standard complementary metal oxide semiconductor (CMOS) processes, the method is less costly and complex than the use of electrically-erasable programmable read-only memories (E2PROMs).

30 Claims, 6 Drawing Sheets

INTEGRATED CIRCUIT CHIP HAVING
NON-VOLATILE ON-CHIP MEMORIES FOR
PROVIDING PROGRAMMABLE FUNCTIONS
AND FEATURES

RELATED APPLICATIONS

This application is a continuation of U.S. Ser. No. 11/034,101, filed Jan. 13, 2005, now U.S. Pat. No. 7,263,027, issued on Aug. 28, 2007, which claims the benefit of U.S. Provisional Application No. 60/618,258, filed Oct. 14, 2004, which are incorporated by reference herein.

BACKGROUND OF THE INVENTION

1. Field of the Invention

The present invention is generally directed to integrated circuit chips having programmable functions and features.

2. Background

It is often desirable to be able to alter the functions and features of an integrated circuit chip during and/or after manufacturing thereof. In order to do so, the chip can be designed in a way such that those features can be programmed using on-chip memory. Conventionally, the on-chip memory required for such programmability has been implemented through, for example, metal fuses and/or electrically-erasable programmable read-only memories (E2PROMs).

Metal fuses have been used, for example, to allow trimming of accurate voltage reference sources in silicon chips. Metal fuses usually occupy a relatively large portion of the silicon die area, therefore limiting the number of fuses which can be included on a single chip. Because of this limitation, the programmability that can be achieved using this method is fairly limited. Also, because blowing metal fuses typically requires the use of a wafer probe, laser, or the like, this approach can only be used prior to packaging of the silicon chip.

E2PROMs can be manufactured at a relatively small die-size. However, the implementation of E2PROMs requires additional processing steps be performed to manufacture the silicon chip, therefore adding significant cost and complexity to the manufacturing process.

What is desired, then, is a method for providing programmable functions and features on an integrated circuit chip that improves upon and addresses the shortcomings of known solutions. For example, the desired approach should occupy less die area as compared to the use of metal fuses but should also be less expensive and complex as compared to the use of E2PROM technology. The desired approach should also permit the integrated circuit chip to be programmed both before and/or after packaging.

BRIEF SUMMARY OF THE INVENTION

An integrated circuit chip in accordance with the present invention provides functions and features that can be programmably modified during and/or after manufacturing in order to suit the needs of a specific customer or application. For example, in an embodiment, functions and features of the silicon chip can be programmably modified after packaging of the chip. Programming is achieved by altering the state of one or more on-chip non-volatile OTP memories.

The use of OTP memories in accordance with the present invention provides an advantage as compared to the use of metal fuses since OTP memories occupy less die area than metal fuses. Additionally, because blowing metal fuses require the use of a wafer probe, laser, or the like, this approach can only be used prior to packaging, whereas OTP memories can be programmed after packaging. Furthermore, since OTP memories can be implemented as part of the same standard fabrication processes used to manufacture the silicon chip, such as standard complementary metal oxide semiconductor (CMOS) processes, the use of OTP memories is considerably less expensive and complex as compared to the use of E2PROM technology, which requires additional processing steps.

Because OTP memories are non-volatile they provide an advantage as compared to volatile memories, such as registers, because they retain stored information even when power is removed from the chip. Thus, a programmable integrated circuit chip in accordance with an embodiment of the present invention will retain its programmed state even after the chip is powered down and then powered up again. In contrast, registers typically must be programmed each time a device is powered up.

In accordance with embodiments of the present invention, the OTP memories may be based on poly-fuses as well as gate-oxide fuses. Applications of the use of OTP memories to alter the functions or features of an integrated circuit chip may include trimming a reference voltage, modifying the sequence of a power sequencing operation, or detecting and storing optimized operating parameters for functions performed either internal to or external to the integrated circuit chip.

In accordance with further embodiments of the present invention, one or more redundant OTP memory cells are advantageously used to achieve reprogrammability and/or to offset the possibility that one or more OTP memory cells are defective or otherwise non-functioning at the time of production of the integrated circuit chip. For example, by providing such redundancy, the integrated circuit chip manufacturer need not test each memory cell on a bit-by-bit basis as is often done for conventional E2PROMs, which is a complex and expensive process. Rather, the possibility of non-functioning OTP memory cells can be compensated for by simply providing a suitable number of redundant OTP memory cells.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE
DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
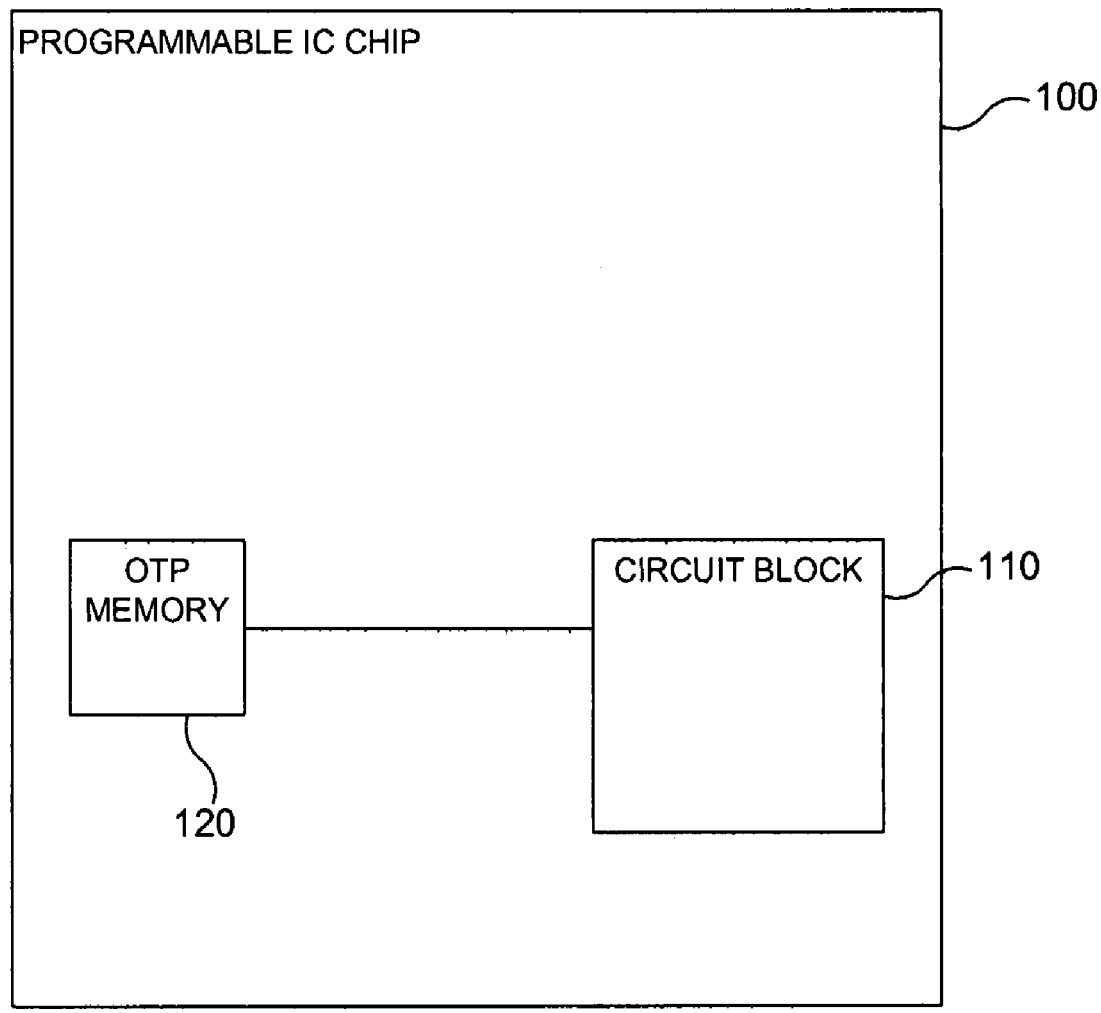
FIG. 1 illustrates a programmable integrated circuit chip having a programmable circuit block in accordance with an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawings in which an element first appears is indicated by the leftmost digit(s) in the corresponding reference number.

DETAILED DESCRIPTION OF THE INVENTION

FIG. 1 illustrates a programmable integrated circuit chip 100 in accordance with an embodiment of the present invention. As shown in FIG. 1, programmable integrated circuit chip 100 includes a circuit block 110 coupled to an OTP memory 120.

Circuit block 110 comprises logic that is configured to perform one or more functions of programmable integrated circuit chip 100. As will be discussed in more detail herein, such functions may include, by way of example, providing a reference voltage or performing a power sequencing function. However, these examples are not intended to be limiting and a person skilled in the art will readily appreciate that numerous other functions may be performed by circuit block 100.

OTP memory 102 comprises one or more OTP memory cells. The OTP memory cells may be arranged as an array or as one or more banks of cells. Each OTP memory cell comprises a non-volatile storage element and a fuse element. The storage element may store either a logic 0 or a logic 1. As will be appreciated by persons skilled in the relevant art(s), programming the OTP memory cell involves applying a programming voltage to rupture or "blow" the fuse element, thereby altering the logic state of the memory cell.

An OTP memory cell may be implemented using gate-oxide fuses. An example of an OTP memory cell implemented using gate-oxide fuses is described in the following commonly-owned U.S. patents, each of which is incorporated by reference herein in its entirety: U.S. Pat. No. 6,525,955, entitled "Memory Cell with Fuse Element," issued Feb. 25, 2003 to Smith et al., U.S. Pat. No. 6,693,819, entitled "High Voltage Switch Circuitry," issued Feb. 17, 2004 to Smith et al., U.S. Pat. No. 6,704,236, entitled "Method and Apparatus for Verification of a Gate Oxide Fuse Element," issued Mar. 9, 2004 to Buer et al., and U.S. Pat. No. 6,707,696 to Turner et al., entitled "Hacker-Proof One Time Programmable Memory," issued Mar. 16, 2004 to Turner et al. However, this example is not intended to be limiting and other fuse structures may be used. For example, OTP memory cells implemented using poly-fuses, which are generally larger than gate-oxide fuses, may also be used to practice the present invention. An example of an OTP memory cell implemented using silicided poly-silicon fuses is set forth in commonly-owned U.S. Pat. No. 6,798,684 entitled "Methods and Systems for Programmable Memory Using Silicided Poly-Silicon Fuses," issued Sep. 28, 2004 to Low et al., the entirety of which is incorporated by reference herein.

An OTP memory cell can be advantageously implemented as part of the same standard CMOS processes used to manufacture programmable integrated circuit chip 100. This provides a distinct advantage over E2PROM memories, which require additional processing steps be performed, therefore adding cost and complexity to the manufacturing process. However, the present invention is not limited to CMOS integrated circuit chips. Rather, it is conceivable that OTP memories could be implemented using other manufacturing processes, which could conceivably include, but are not limited to, bipolar, BiCMOS, and BCDMOS fabrication processes.

OTP memory 102 can be programmed during and/or after manufacturing of programmable integrated circuit chip 100 to a desired logic state. Advantageously, OTP memory 102 may be programmed after packaging of programmable circuit chip 100. This may be achieved, for example, by using one or more external pins of integrated circuit chip 100 to perform a memory write function.

As will be illustrated in more detail herein, in response to the programmed state of OTP memory 102, circuit block 110 performs a function in one of a plurality of operating modes.

In accordance with the nature of OTP memory, each memory cell within OTP memory 102 can be programmed only once. Hence, in accordance with an embodiment of the present invention, redundant OTP memory cells are provided within OTP memory 102 to achieve reprogrammability. For example, redundant banks of one or more OTP memory cells may be used to implement OTP memory 102, wherein a single bank of OTP memory is used each time OTP memory 102 is programmed. A separate address bank of OTP memory cells can be maintained to identify which OTP data bank is the most current bank.

Redundant memory cells can be particularly useful for allowing re-writes in case a programming error occurs that improperly sets the state of OTP memory 102. Persons skilled in the relevant art(s) will appreciate that selecting the optimal amount of redundancy may depend on various factors including the available die space, the type of application being programmed, the anticipated frequency of reprogramming, and the anticipated rate of erroneous memory writes.

Furthermore, redundant OTP memory cells may advantageously be used to offset the possibility that one or more OTP memory cells are defective or otherwise non-functioning at the time of production of integrated circuit chip 100. By providing such redundancy, the manufacturer of integrated circuit chip 100 need not test each memory cell on a bit-by-bit basis as is often done for conventional E2PROMs, which is a complex and expensive process. Rather, the possibility of non-functioning OTP memory cells can be compensated for by simply designing a chip having a suitable number of redundant OTP memory cells.

Figure 2:
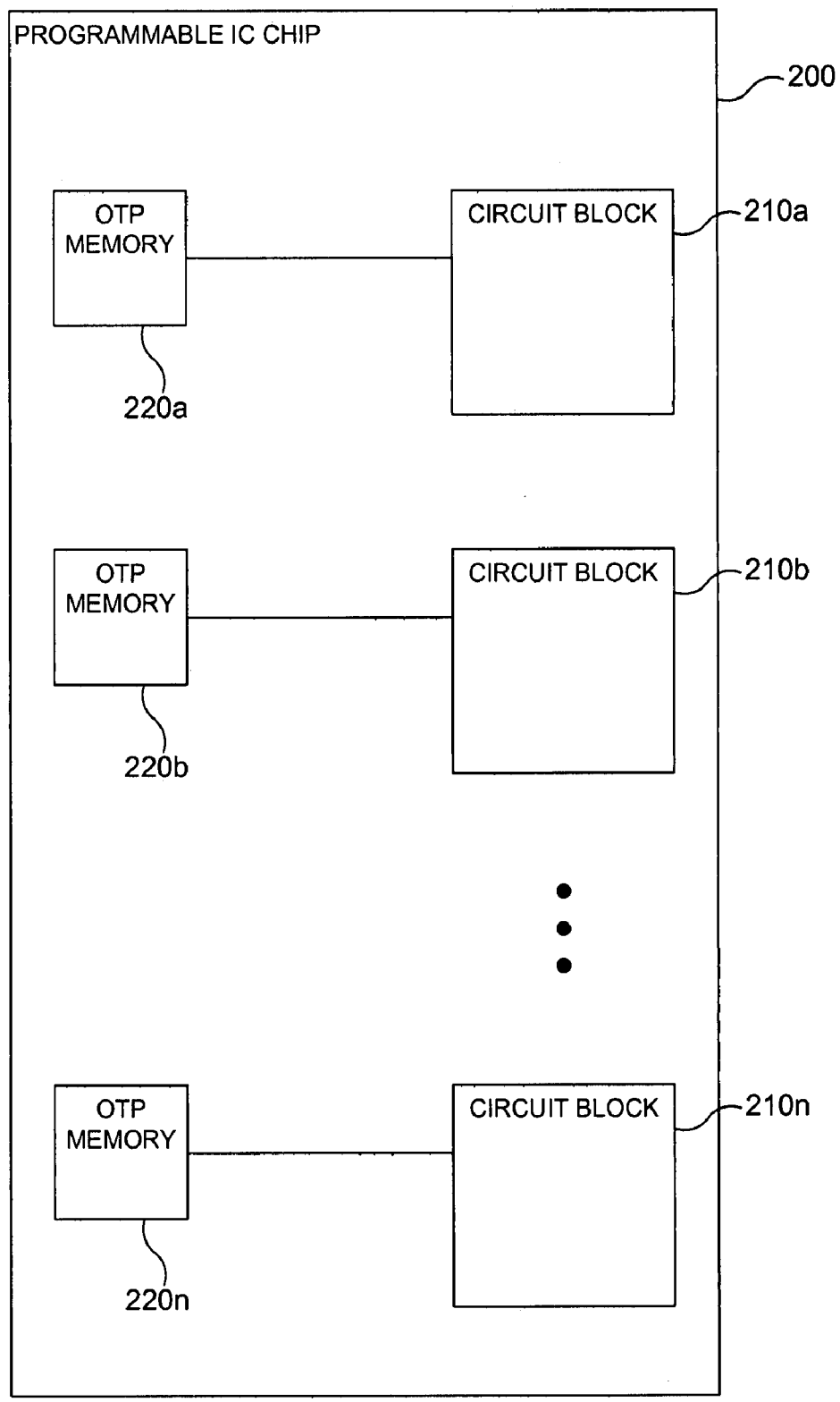
FIG. 2 illustrates a programmable integrated circuit chip having multiple programmable circuit blocks in accordance with an embodiment of the present invention.

FIG. 2 illustrates a programmable integrated circuit chip 200 having multiple programmable circuit blocks in accordance with an embodiment of the present invention. As shown in FIG. 2, programmable integrated circuit chip 200 includes a plurality of circuit blocks 210a-210n, each of which is coupled to a corresponding one of a plurality of OTP memory 220a-220n.

Each circuit block 210a comprises logic that is configured to perform one or more functions of programmable integrated circuit chip 200. Each OTP memory 202a-202n can be programmed during and/or after manufacturing of programmable integrated circuit chip 200 to a desired logic state. In response to the programmed state of each OTP memory 202a-

202n, each circuit block 210a-210n performs a function in one of a plurality of operating modes.

In addition to the examples provided in FIGS. 1 and 2, the present invention also encompasses embodiments in which multiple OTP memories are utilized to programmably select one or more operating modes of a single circuit block or in which a single OTP memory is used to programmably select one or more operating modes of multiple circuit blocks.

Figure 3:
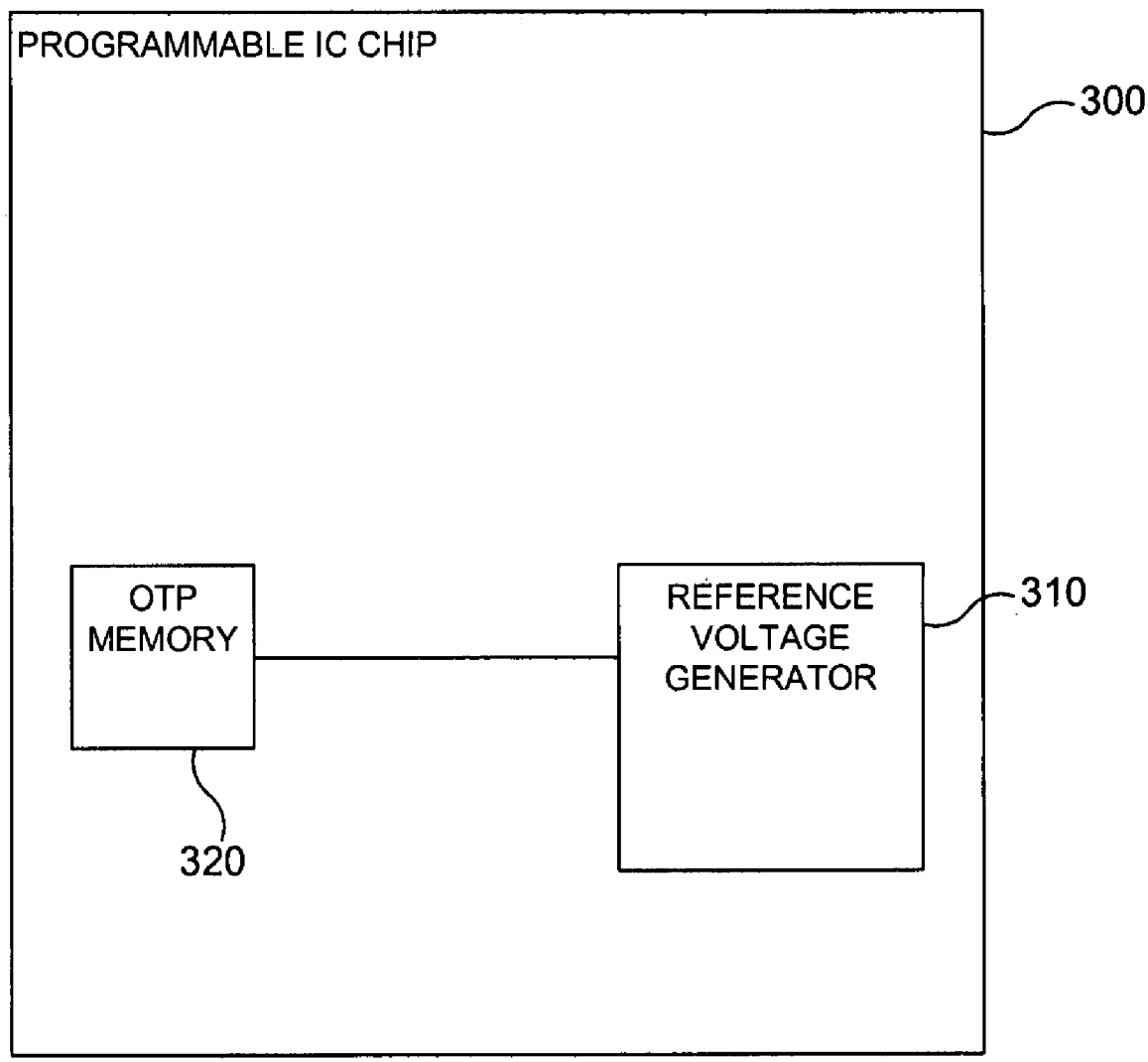
FIG. 3 illustrates a programmable integrated circuit chip that includes a programmable reference voltage generation function in accordance with an embodiment of the present invention.
Figure 4:
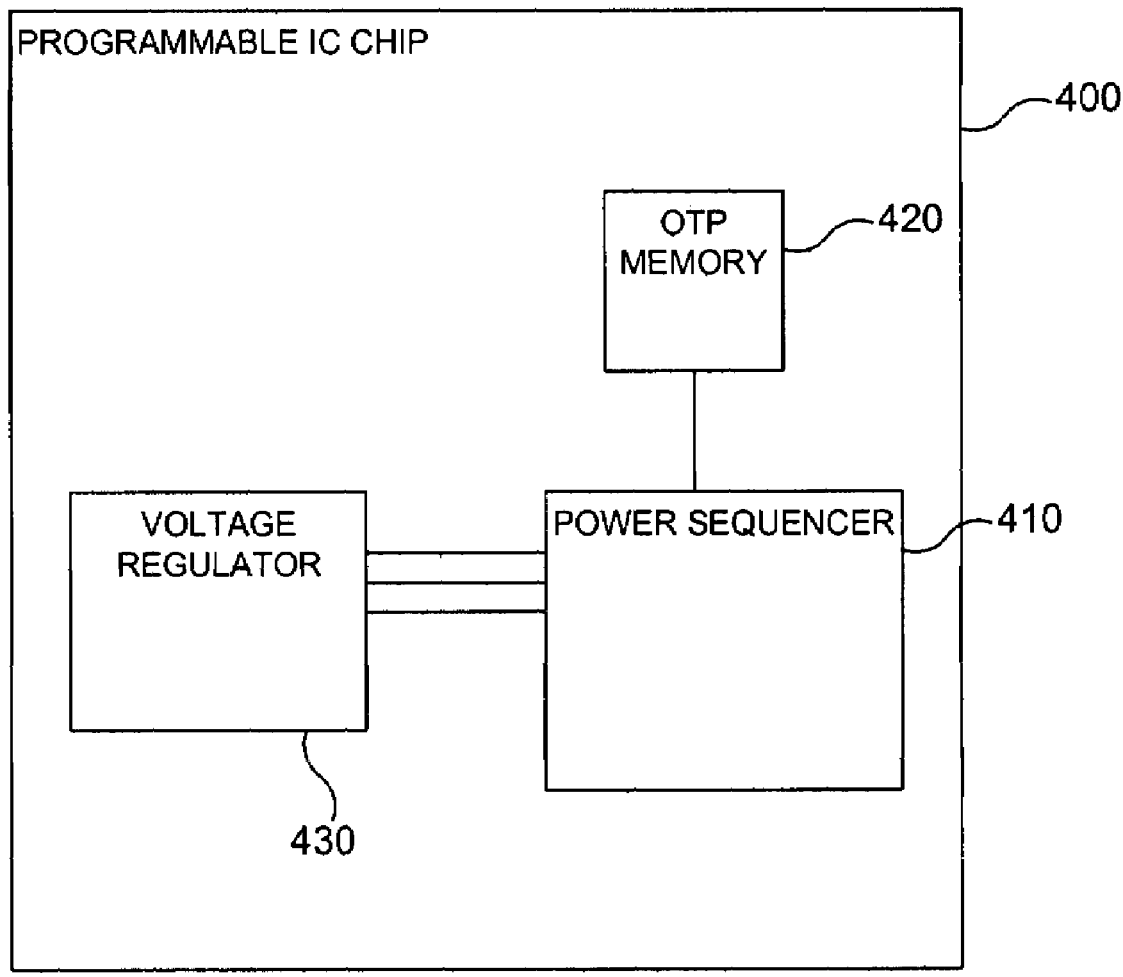
FIG. 4 illustrates a programmable integrated circuit chip that includes a programmable power sequencing function in accordance with an embodiment of the present invention.
Figure 5:
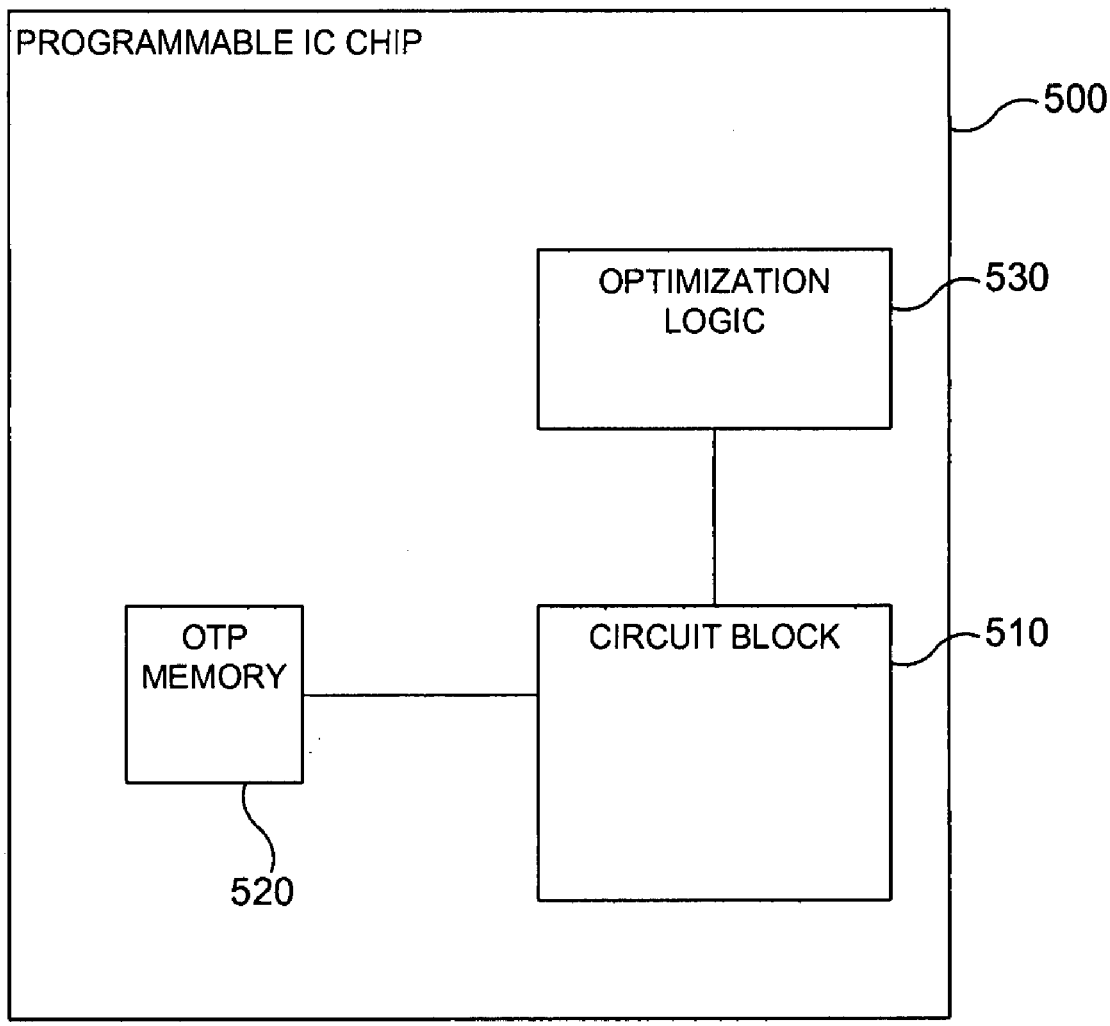
FIG. 5 illustrates a programmable integrated circuit chip that detects and stores optimized operating parameters for an application in accordance with an embodiment of the present invention.

Various examples of functions and features of a programmable integrated circuit chip will now be provided in reference to FIGS. 3, 4 and 5.

FIG. 3 illustrates a programmable integrated circuit chip 300 that includes a programmable reference voltage generation function in accordance with an embodiment of the present invention. As shown in FIG. 3, integrated circuit chip 300 includes a programmable reference voltage generator 310 coupled to an OTP memory 320.

Reference voltage generator 310 is configured to generate a reference voltage that is used by one or more circuit structures within integrated circuit chip 300. For example, reference voltage generator 310 may generate a bandgap reference voltage that is used by one or more comparators within integrated circuit chip 300. In accordance with the embodiment depicted in FIG. 3, OTP memory 320 can be programmed to modify, or trim, the reference voltage generated by reference voltage generator 310 during and/or after manufacturing of integrated circuit chip 300. For example, by enabling the trimming of the reference voltage during and/or after manufacturing in this fashion, an embodiment of the present invention may be used to fine-tune the performance of sensitive analog functions by integrated circuit chip 300.

FIG. 4 illustrates a programmable integrated circuit chip 400 that includes a programmable power sequencing function in accordance with an embodiment of the present invention. As shown in FIG. 4, integrated circuit chip 400 includes a programmable power sequencer 410 that is coupled to a voltage regulator 430 and an OTP memory 420.

Voltage regulator 430 is configured to convert a source voltage into a plurality of output voltages. For example, voltage regulator may convert a 5 V source voltage into three output voltages of 1.2 V, 1.8 V and 3.3 V. Power sequencer 410 is configured to receive the plurality of output voltages from voltage regulator 430 and provide them in a predefined sequence to one or more circuit structures within integrated circuit chip 400. For example, power sequencer 410 may be used to provide a sequence of power supply voltages to another circuit block within integrated circuit chip 400. Alternatively, power sequencer 410 may be used to provide a sequence of power supply voltages to a device that is external to integrated circuit chip 400.

In accordance with the embodiment depicted in FIG. 4, OTP memory 420 can be programmed to alter the sequence in which power sequencer provides the plurality of output voltages. Thus, for example, where the output voltages are 1.2 V, 1.8 V, and 3.3 V, as discussed above, OTP memory 420 can be programmed to provide the three output voltages in any desired sequence, depending on the state of OTP memory 402. Thus, for one application the sequence could be programmed to be 3.3 V, 1.8 V, and 1.2 V, while for another application the sequence could be programmed to be 1.8 V, 3.3 V, and 1.2 V. The number of different sequences that may be programmed is limited only be the number of states capable of being stored by OTP memory 402.

In an alternate embodiment, OTP memory 402 is used to program a predefined slew rate at which a voltage is provided by power sequencer 410. In a still further embodiment (not shown), one or more output voltages delivered by voltage regulator 430 can be programmably selected or modified based on the state of OTP memory 402.

FIG. 5 illustrates a programmable integrated circuit chip 500 that detects and stores optimized operating parameters for an application in accordance with an embodiment of the present invention. As shown in FIG. 5, integrated circuit chip 500 includes a circuit block 510 coupled to optimization logic 530, each of which is coupled to an OTP memory 520.

Circuit block 510 comprises logic that is configured to perform one or more functions of programmable integrated circuit chip 500. Optimization logic 530 is configured to determine one or more optimized operating parameters, such as an optimized operating voltage, frequency, current or charge to be utilized by one or more circuit structures within circuit block 510. In an embodiment, optimization logic 530 determines one or more optimized operating parameters as part of a "wake up" sequence for integrated circuit chip 500. Once optimization logic 530 has determined an optimized operating parameter, that parameter (or state information corresponding to that parameter) is stored in OTP memory 520 and is subsequently used as a default operating parameter for circuit block 510. Circuit block 510 is responsive to the default operating parameter stored in OTP memory 520 to perform a function in one of a plurality of operating modes.

In an embodiment, when integrated circuit chip 500 is first powered up, the operation of circuit block 510 is controlled, in part, by one or more default operating parameters. After power up, however, integrated circuit chip 500 executes a "wake up" sequence, in which optimized operating parameters are determined by optimization logic as discussed above and stored in OTP memory 520. Thereafter, when integrated circuit chip is subsequently powered up, the default operating parameters will be those optimized operating parameters stored in OTP memory 520.

Figure 6:
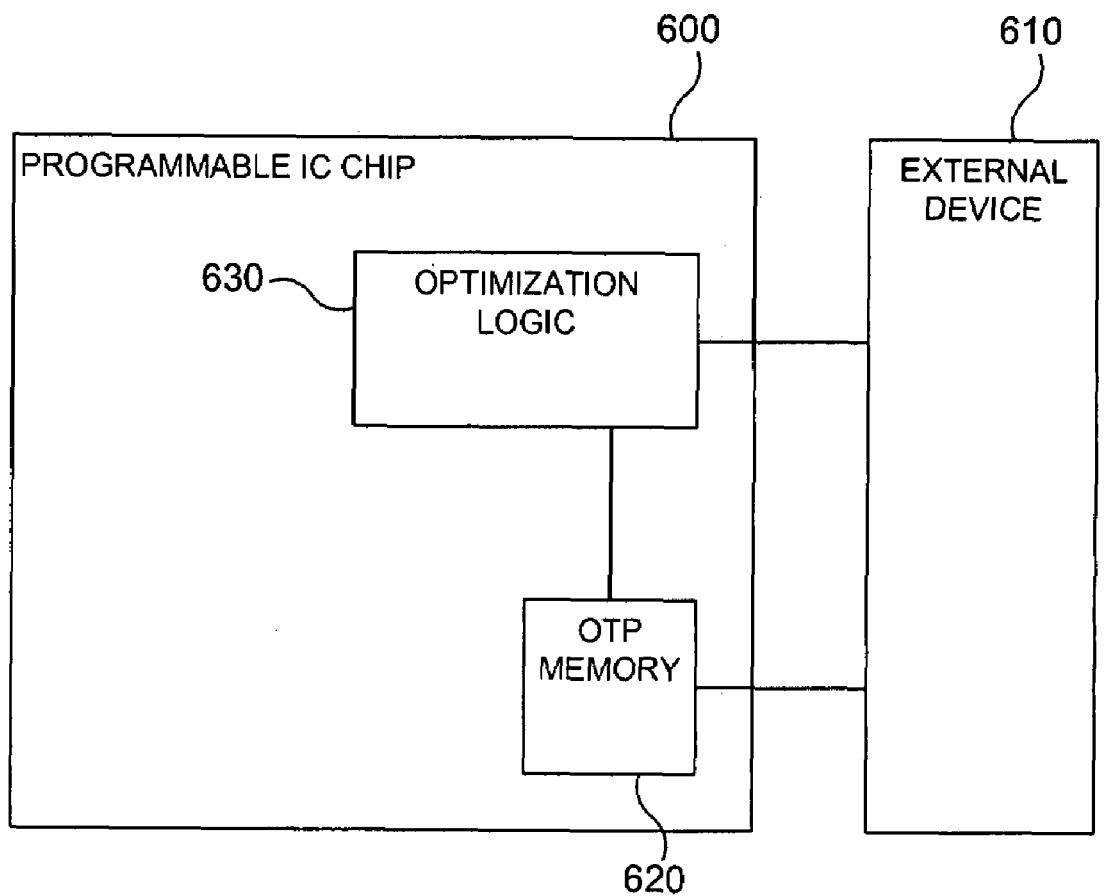
FIG. 6 depicts a programmable integrated circuit chip that detects and stores optimized operating parameters for a device that is external to the integrated circuit chip in accordance with an embodiment of the present invention.

FIG. 6 depicts an alternate embodiment in which an integrated circuit chip 600 includes optimization logic 630 that is configured to determine one or more optimized operating parameters for a device 610 that is external to integrated circuit chip 600, such as but not limited to another integrated circuit chip. Optimized operating parameters are stored in OTP memory 620 and then subsequently used by external device 610 as default operating parameters to permit external device 610 to power up in an optimized operating state.

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A programmable integrated circuit chip, comprising:
a circuit block configured to perform a function; and
a memory, including a plurality of redundant one-time programmable (OTP) memory banks, wherein one of the OTP memory banks is configured to identify a current bank of the plurality of redundant OTP memory banks that is programmed;
wherein the memory is coupled to the circuit block, the memory being programmed after packaging of the circuit chip;

wherein the circuit block is responsive to a programmed state of the memory to perform the function in one of a plurality of operating modes.

2. The programmable integrated circuit chip of claim 1, wherein the circuit chip is manufactured using a process selected from the group consisting of a complementary metal oxide semiconductor (CMOS) process, a bipolar process, a BiCMOS process, and a BCDMOS process.

3. The programmable integrated circuit chip of claim 1, wherein one of the banks of the plurality of redundant OTP memory banks provides additional storage in the instance that the current second bank of the plurality of redundant OTP memory banks is non-functional or is sought to be reprogrammed.

4. The programmable integrated circuit chip of claim 1, wherein one of the banks of the plurality of redundant OTP memory banks includes an OTP memory cell, wherein the OTP memory cell includes a non-volatile storage element and a fuse element.

5. The programmable integrated circuit chip of claim 4, wherein the fuse element comprises a gate-oxide fuse element.

6. The programmable integrated circuit chip of claim 4, wherein the fuse element comprises a poly-fuse element.

7. The programmable integrated circuit chip of claim 1, further comprising:
an external pin coupled to the memory, whereby data can be written to the memory via the external pin.

8. The programmable integrated circuit chip of claim 1, wherein the circuit block comprises a reference voltage generator configured to generate a reference voltage and wherein the reference voltage generator is responsive to a programmed state of the memory to alter the level of the reference voltage.

9. The programmable integrated circuit chip of claim 8, further comprising:
a comparator, wherein the reference voltage generator is configured to generate a bandgap reference voltage to be used by the comparator.

10. The programmable integrated circuit chip of claim 1, wherein the circuit block comprises a power sequencer configured to generate a sequence of output voltages and wherein the power sequencer is responsive to a programmed state of the memory to alter the sequence of output voltages.

11. The programmable integrated circuit chip of claim 10, further comprising:
a voltage regulator;
wherein the power sequencer is configured to receive a plurality of voltages from the voltage regulator, wherein the sequence of output voltages comprises the plurality of voltages received from the voltage regulator.

12. The programmable integrated circuit chip of claim 1, further comprising:
optimization logic coupled to the circuit block and the memory, the optimization logic configured to determine an optimized operating parameter for the circuit block and to store state information relating to the optimized operating parameter in the memory.

13. The programmable integrated circuit chip of claim 12, wherein the optimized operating parameter is one or more of a voltage level, a frequency, a current, or a charge.

14. A programmable integrated circuit, comprising:
a memory, including a plurality of redundant one-time programmable (OTP) memory banks, wherein one of the OTP memory banks is configured to identify a current bank of the plurality of redundant OTP memory banks that is programmed; and
optimization logic connected to the memory, the optimization logic configured to determine an optimized operating parameter for a device external to the programmable integrated circuit and to store state information relating to the optimized operating parameter in the memory for subsequent access by the external device.

15. The programmable integrated circuit chip of claim 14, wherein the optimized operating parameter is one or more of a voltage level, a frequency, a current, or a charge.

16. A method for operating a programmable integrated circuit chip that includes a memory, comprising:
programming a first one-time programmable (OTP) memory bank of the memory after packaging of the circuit chip;
configuring a second OTP memory bank to identify the first memory bank; and
performing a function within the programmable integrated circuit chip in one of a plurality of operating modes in response to a programmed state of the first OTP memory bank.

17. The method of claim 16, wherein programming the first OTP memory bank comprises programming an OTP memory cell, wherein the OTP memory cell comprises a fuse element and a storage element.

18. The method of claim 17, wherein programming the OTP memory cell comprises blowing the fuse element within the OTP memory cell.

19. The method of claim 18, wherein blowing the fuse element within the OTP memory cell comprises blowing a gate-oxide fuse element within the OTP memory cell.

20. The method of claim 18, wherein blowing the fuse element within the OTP memory cell comprises blowing a poly-fuse element within the OTP memory cell.

21. The method of claim 16, wherein programming the first OTP memory bank comprises performing a memory write operation via an external pin of the programmable integrated circuit chip.

22. The method of claim 16, wherein performing a function within the programmable integrated circuit chip in one of a plurality of operating modes in response to the programmed state of the memory comprises generating a reference voltage wherein the level of the reference voltage is determined based on the programmed state of the first OTP memory bank.

23. The method of claim 16, wherein performing a function within the programmable integrated circuit chip in one of a plurality of operating modes in response to the programmed state of the memory comprises generating a sequence of output voltages wherein the sequence is determined based on the programmed state of the first OTP memory bank.

24. The method of claim 16, wherein performing a function within the programmable integrated circuit chip in one of a plurality of operating modes in response to the programmed state of the memory comprises generating one of a frequency, a current, or a charge based on the programmed state of the first OTP memory bank.

25. The method of claim 16, further comprising:
determining an optimized operating parameter for performing the function within the programmable integrated circuit chip;
wherein programming the first OTP memory bank after packaging of the circuit chip comprises storing state information relating to the optimized parameter in the first OTP memory bank.

26. The method of claim 25, wherein determining an optimized operating parameter comprises determining one or more of a voltage level, a frequency, a current, or a charge.

27. A method for operating a programmable integrated circuit chip that includes a memory, comprising:

determining an optimized operating parameter for the performance of a function by a device external to the programmable integrated circuit chip;

storing state information relating to the optimized operating parameter in a first one-time programmable (OTP) memory bank after packaging of the circuit chip for subsequent access by the external device; and configuring a second OTP memory bank to identify the first OTP memory bank as being programmed.

28. The method of claim 27, wherein determining an optimized operating parameter comprises determining one or more of a voltage level, a frequency, a current, or a charge.

29. The method of claim 27, wherein the current redundant OTP memory bank provides additional storage in the instance that the first OTP memory bank is non-functional or is sought to be reprogrammed.

30. The method of claim 27, further comprising:

programming a third OTP memory bank if the first OTP memory bank becomes non-functional or is sought to be reprogrammed.

* * * * *